(12) United States Patent
Newman

(10) Patent No.: US 8,366,296 B2
(45) Date of Patent: Feb. 5, 2013

(54) LIGHTING APPARATUS FOR ILLUMINATING ACCESSIBLE AREAS

(75) Inventor: Shane Vincent Lee Newman, Durham (GB)

(73) Assignee: Graviton Lite Limited, Stanley, County Durham (GB)

(*) Notice: Subject to any disclaimer, the term of this patent is extended or adjusted under 35 U.S.C. 154(b) by 349 days.

(21) Appl. No.: 12/806,771

(22) Filed: Aug. 20, 2010

(65) Prior Publication Data
US 2011/0058373 A1  Mar. 10, 2011

(30) Foreign Application Priority Data
Aug. 20, 2009  (GB) .................................. 0914582.2

(51) Int. Cl.
*F21S 4/00* (2006.01)
*F21V 21/00* (2006.01)
(52) U.S. Cl. ............... 362/249.02; 362/311.02; 362/800
(58) Field of Classification Search ............... 362/97.3, 362/249.02, 311.02, 545, 612, 800
See application file for complete search history.

(56) References Cited

U.S. PATENT DOCUMENTS

| 5,807,122 | A | 9/1998 | Heeb et al. |
| 2004/0252502 | A1 | 12/2004 | McCullough et al. |
| 2005/0276053 | A1 | 12/2005 | Nortrup et al. |
| 2007/0012942 | A1 | 1/2007 | Wu |
| 2008/0002399 | A1 | 1/2008 | Villard et al. |

FOREIGN PATENT DOCUMENTS

| EP | 1617131 | 1/2006 |
| JP | 2007/189006 | 7/2007 |

*Primary Examiner* — Jason Moon Han
(74) *Attorney, Agent, or Firm* — James Creighton Wray

(57) ABSTRACT

Lighting apparatus includes a casing (401) moulded from an electrically insulating and thermally conductive plastics material. It also includes a plurality of light emitting diode devices (501) configured to emit light in response to receiving electrical power. A plurality of metallic assemblies (601) are provided, in which each one provides electrical power to a respective one of the light emitting diodes. In addition, these assemblies conduct heat away from their respective light emitting diode to the casing. They are directly supported by the casing and allow each light emitting diode to be individually replaced.

19 Claims, 8 Drawing Sheets

LIGHTING APPARATUS FOR ILLUMINATING ACCESSIBLE AREAS

CROSS REFERENCE TO RELATED APPLICATIONS

This application claims priority from United Kingdom Patent Application No. 0914582.2, filed Aug. 20, 2009, the whole contents of which are incorporated herein by reference in their entirety.

BACKGROUND OF THE INVENTION

1. Field of the Invention

The present invention relates to lighting apparatus for illuminating accessible areas making use of a plurality of light emitting diode devices configured to emit light in response to receiving electrical power.

2. Description of the Related Art

Systems for lighting large areas that deploy light emitting diodes are known. These devices are known to be more efficient in terms of the amount of light emitted compared to the electrical energy consumed. However, given that such devices must be supported within a housing, they still generate a degree of heat energy which must be dissipated to atmosphere. Known apparatus include mountings fabricated from aluminium thereby providing a suitable heat sink. However, the production of such devices is expensive and requires the use of expensive materials. Furthermore, known fabrications do not facilitate the removal of individual LED devices.

BRIEF SUMMARY OF THE INVENTION

According to an aspect of the present invention, there is provided lighting apparatus for illuminating accessible areas, comprising: a casing moulded from an electrically isolating and thermally conductive plastics material; a plurality of light emitting diodes (LED) devices configured to emit light in response to receiving electrical power; and a plurality of metallic assemblies, wherein each one of said metallic assemblies provides electrical power to a respective one of said LED devices, conducts heat from its respective LED device to said casing, is directly supported by said casing and allows each LED device to be individually replaced.

The present invention allows the moulded casing to hold the metallic assemblies directly to facilitate thermal conduction. The provision of a solid polymer material significantly reduces fabrication costs.

The provision of separate metallic assemblies for each LED device allows the rapid interchange of LED devices. Furthermore, the supporting electronic power supply is configured to provide appropriate power levels and pulsed waveforms for a wide selection of LED devices, including devices operable over a range of light emitting frequencies, including infrared, visible frequencies and ultraviolet frequencies.

DETAILED DESCRIPTION OF EMBODIMENTS

FIG. 1

Figure 1:
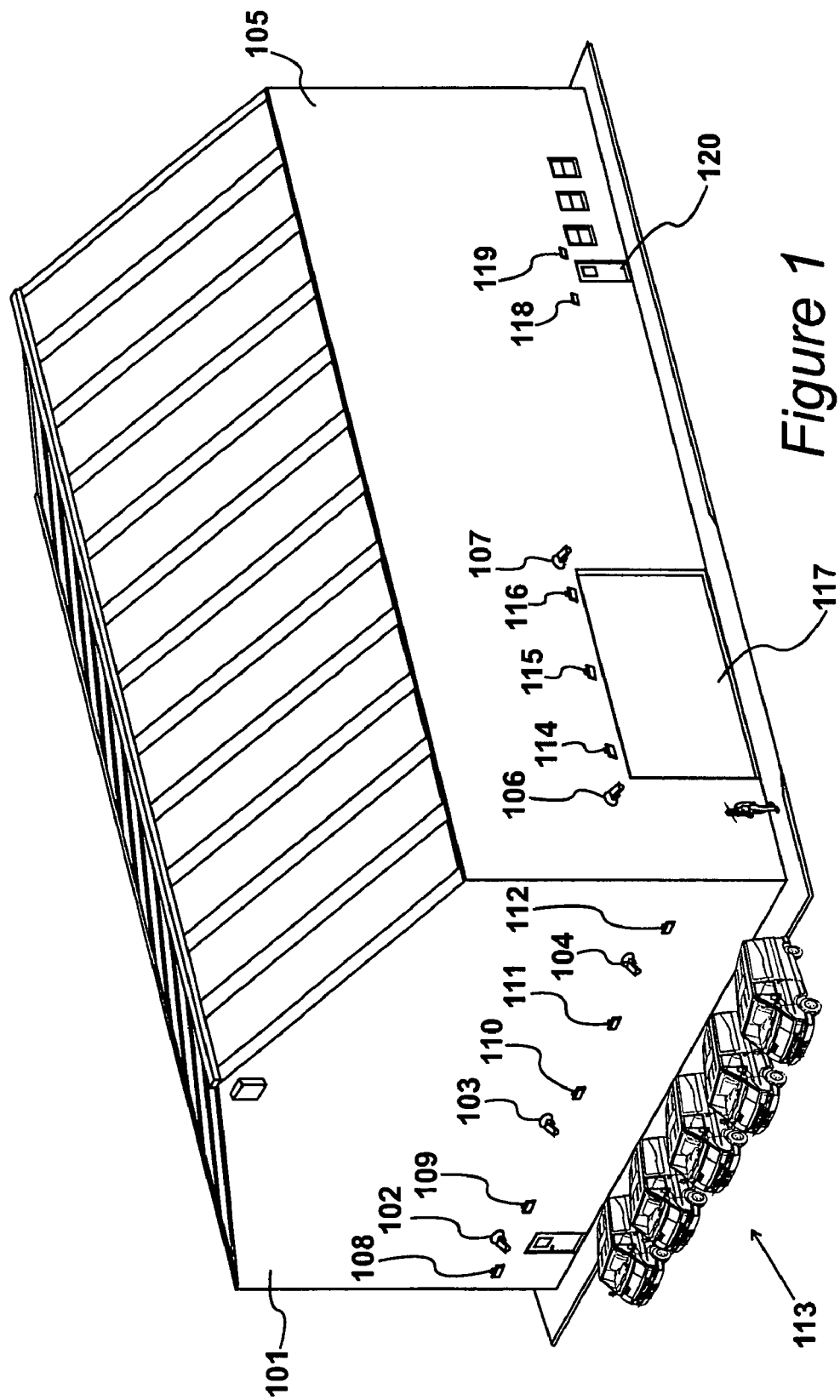
FIG. 1 shows an external area illuminated by an embodiment of the present invention.

An external area illuminated by an embodiment of the present invention is illustrated in FIG. 1. The environment illustrates a warehouse 101 in which a first set of security cameras 102, 103 and 104 are mounted on a first wall. On a second wall 105 a second set of security cameras 106 and 107 are provided.

Lighting apparatus embodying the present invention are attached to the first wall at locations 108, 109, 110, 111 and 112. Lighting apparatus 108 to 112 illuminate an area 113 where vehicles are parked, although it is possible this may not have been known initially when the lights 108 to 112 and Cameras 102 to 104 were installed. These lights 108 to 112, working in co-operation with cameras 102 to 104, monitor vehicles parked in area 113 and as such it is desirable for the cameras 102 to 104 to capture video material in a form which allows the colour of the vehicles to be recognised. Thus, in this way, there is clearer evidence as to which vehicles are parked in area 113.

Lighting apparatus 114, 115 and 116 co-operate with video cameras 106 and 107 on the second wall 105. Vehicles enter the warehouse via door 117 but personal would be aware of the exact nature of the vehicles so using the warehouse in this way, therefore the video record is not so important. Consequently, a different type of illumination may be deployed for lighting systems 114 to 116, compared to lighting systems 108 to 112.

Further lighting apparatus is provided at 118 and 119 effectively providing illumination above a door 120. Lighting 118 and 119 is not provided for security purposes, there is no camera deployed with these lights, but the lighting is provided for safety reasons. Thus, the actual colour of the lighting is not so important provided that sufficient illumination is provided in the region of door 120.

It is also appreciated that the requirements for the lighting systems shown in FIG. 1 may change over a period of time. Thus, for example in security applications it may be preferable to use infrared lighting which is visible to the video cameras but does not create unnecessary light pollution. In applications where lighting is provided primarily for safety reasons, the actual colour of the emitted light is of little importance provided that the lighting is sufficiently bright. Thus, emphasis may be placed on lighting efficiency. Similarly, in areas where colour is important, such as when recording the colour of vehicles, white light will be required to ensure that the colour information is correctly recorded. The present invention facilitates the changing of individual LED devices within the lighting apparatus thereby allowing a change to be made to the type of light emitted relatively quickly and easily should the requirement for illumination in the space under consideration to change.

FIG. 2

Figure 2:
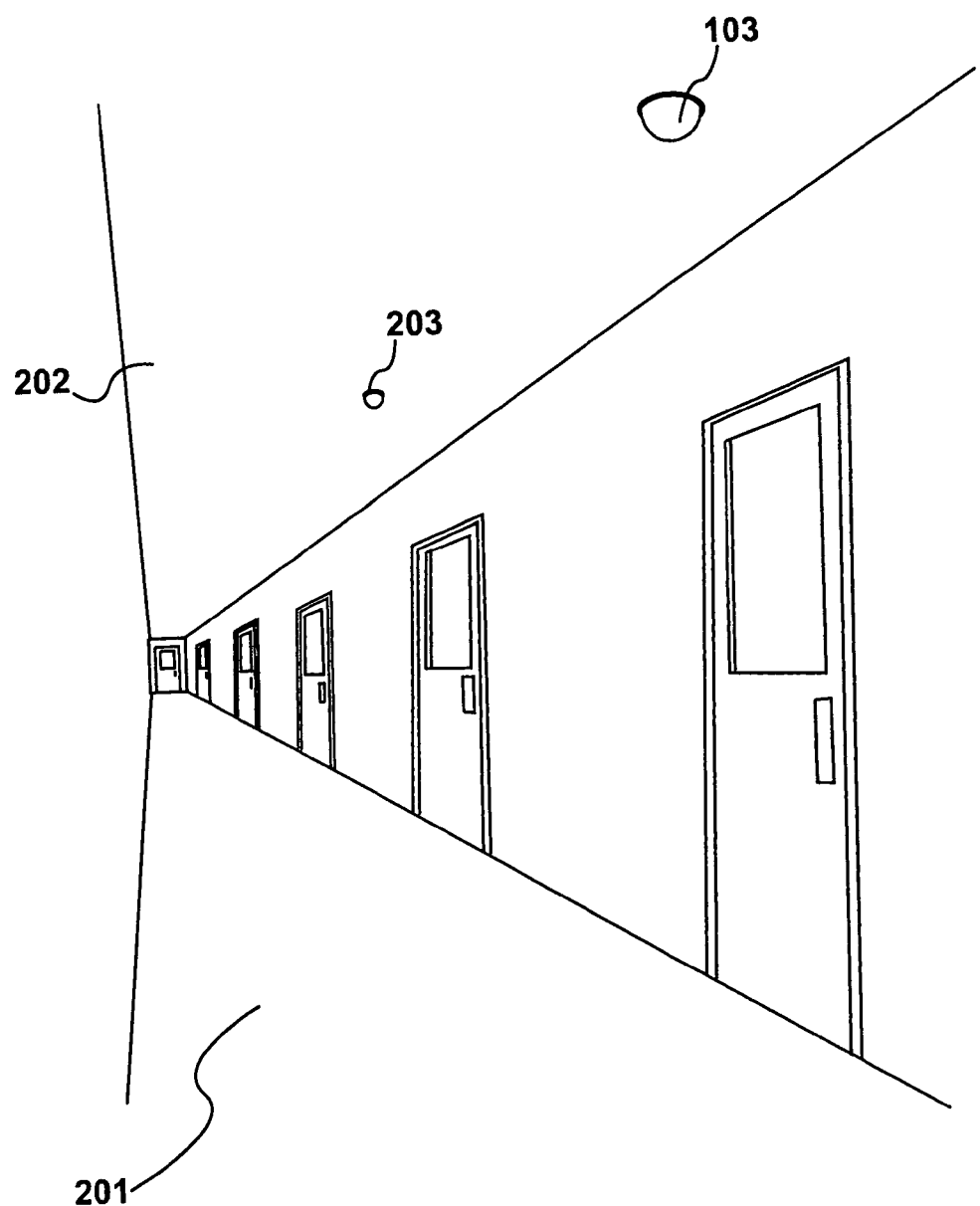
FIG. 2 shows an internal area accessible to people of the type where an embodiment of the invention may be deployed.

An internal area accessible to people of the type where an embodiment of the invention may be deployed, is illustrated in FIG. 2. A corridor 201 is shown providing access through a large building. In this example, the building is open to public access during part of the day, while being restricted at other times. During normal access periods, lighting is provided by conventional lighting devices, possibly housed within a suspended ceiling 202. However, this conventional lighting would be considered excessive during times when access to the area is restricted but the absence of any lighting at all could create security related problems. Thus, in this example, the corridor 201 is fitted with security surveillance video cameras 203 which, although not requiring large amounts of light in order to be operational, do require a degree of lighting. The environment would therefore benefit from the inclusion of security lighting which would then operate in co-operation with video recording devices, including cameras 203.

FIG. 3A

An embodiment of the present invention is wall mounted so as to facilitate installation, repair and access. During the installation process, a mounting bracket 301 is secured firmly to a wall 302.

FIG. 3B

After securing the mounting bracket 301 to wall 302, lighting apparatus 303 is located upon bracket 201 such that its orientation may be adjusted and the lighting apparatus as a whole may be replaced.

The lighting apparatus 301 includes a plurality of light emitting diode (LED) devices configured to emit light in response to receiving electrical power. The LED devices use substantially less electrical power than conventional incandescent lighting and typically operate between 12 volt and 24 volt. In some systems, the lighting devices themselves may receive electrical power that is at this voltage or alternatively they may be supplied with mains electricity (110 volt to 240 volt) with circuitry being provided at the devices themselves to perform the necessary transformation to the lower voltage. In addition, circuitry is included for adjusting the degree of power supplied to each of the LED devices, often by a process of pulse width modulation as is well known in the art.

FIG. 4

Figure 4:
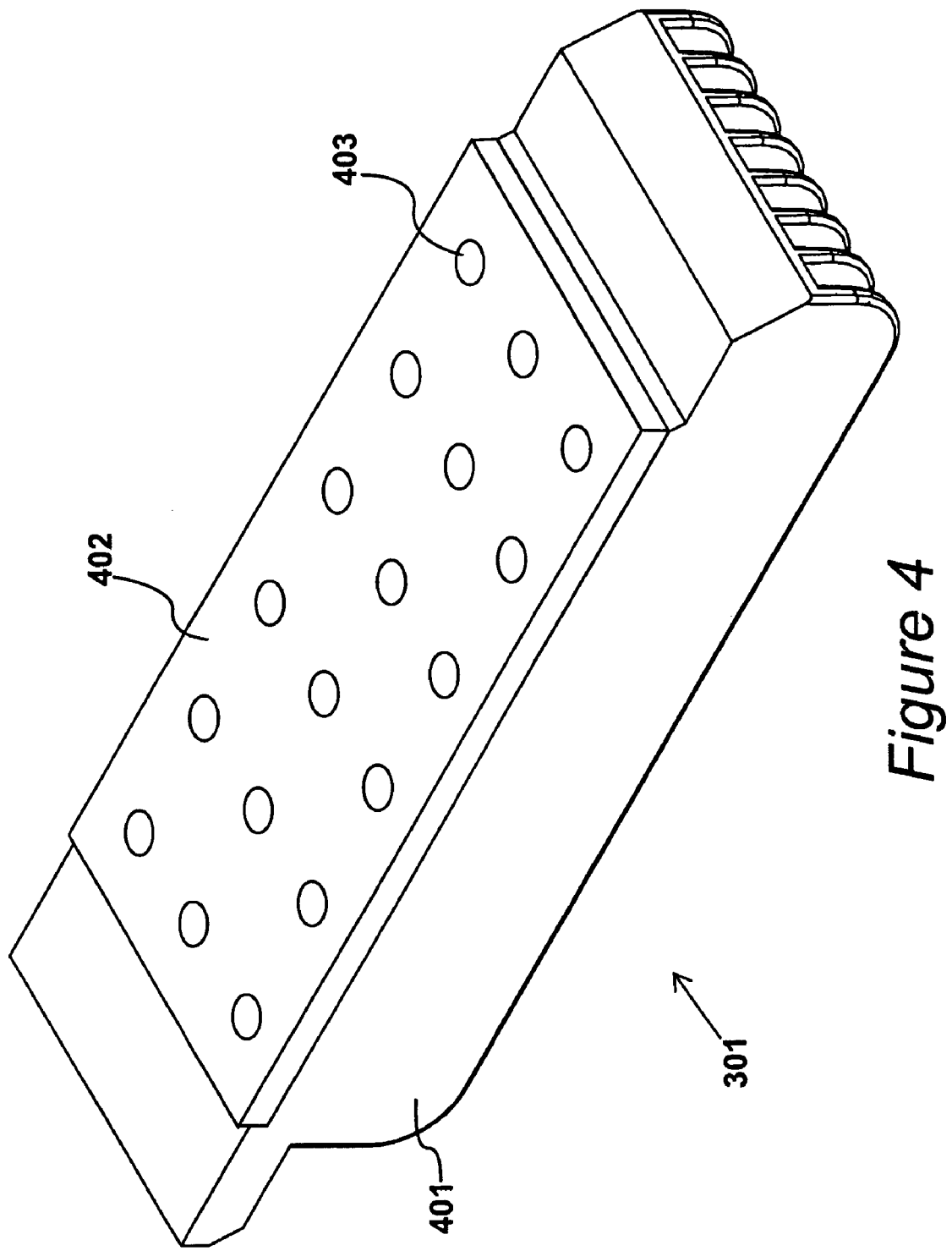
FIG. 4 shows the lighting apparatus identified in FIG. 3.

Lighting apparatus 301 is shown in FIG. 4. The apparatus includes a casing 401 that is moulded from an electrically isolating and thermally conductive plastics material. Suitable examples for the plastics material are E2 thermally conductive liquid crystalline polymer; E3603 thermally conductive polyamide 4, 6; E3605 thermally conductive polyamide 4, 6; E4501 thermally conductive polycarbonate; E405 thermally conductive polycarbonate and E4507 thermally conductive polycarbonate. However, it should be appreciated that this does not represent an exhaustive list and the requirement is for a plastics material that is mouldable, thermally conductive and electrically insulating.

The apparatus is provided with a transparent cover plate 402 beneath which is arranged a matrix of light emitting diode devices, each of which may have an associated lens diffuser within the transparent cover plate 402.

Inside the moulded casing 401, a plurality of metallic assemblies are restrained by the moulding so as to provide mechanical support for the LED devices, electrical connectivity and thermal heats transmission. The metallic assemblies are detailed in FIG. 5.

FIG. 5

Figure 5:
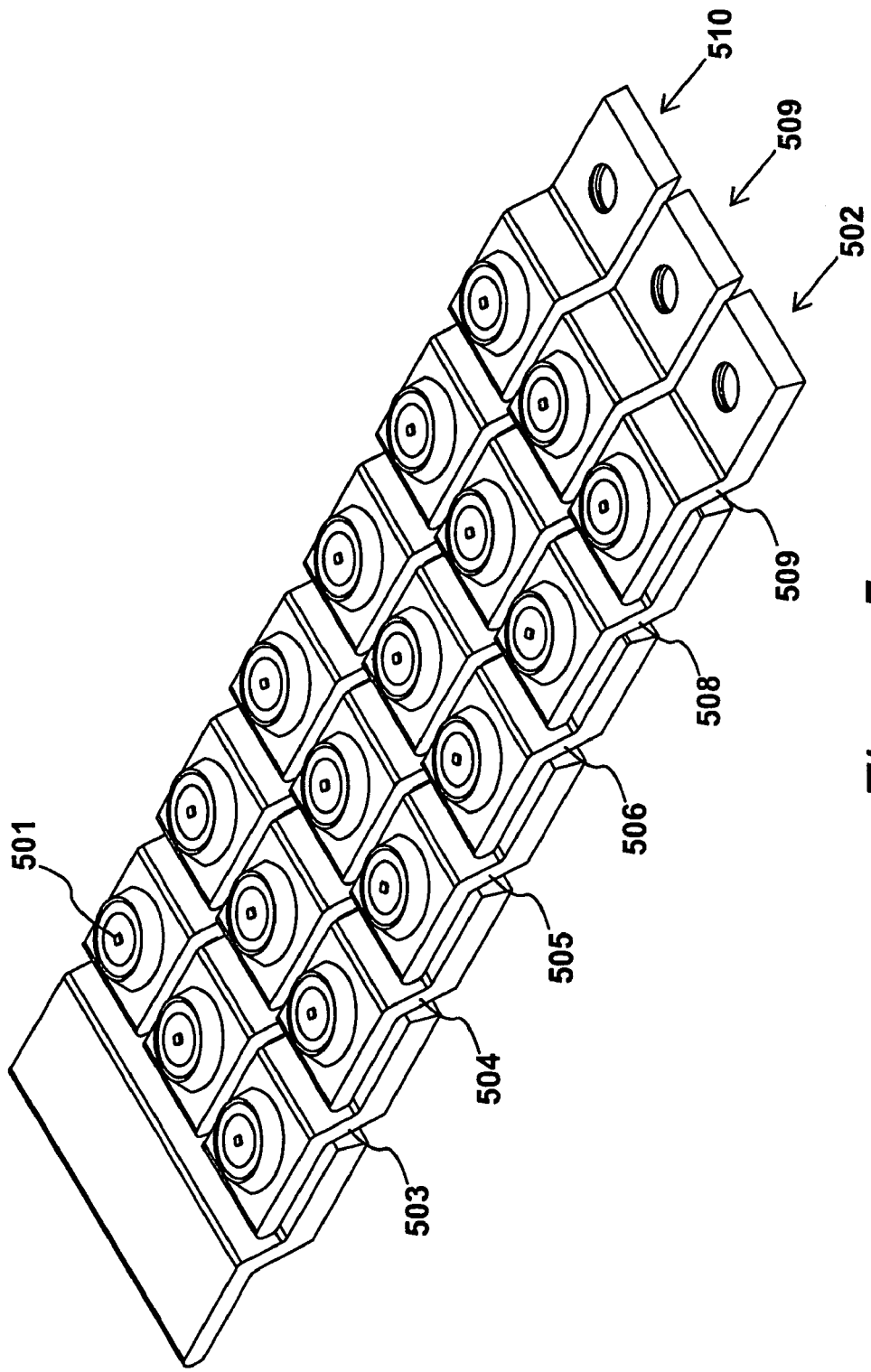
FIG. 5 shows the internal metallic assemblies contained in the apparatus identified in FIG. 4.

A plurality of metallic assemblies are illustrated in FIG. 5, each one providing electrical power to a respective one of the LED devices. In addition, these metallic assemblies conduct heat away from their respective LED device such that this heat may be dissipated to atmosphere through the thermally conductive casing 401. Each assembly is directly supported by the casing 301 and the provision of these metallic assemblies allows each LED device to be individually replaced.

Replacement may occur due to degradation or alternatively LED replacement may be required if an alternative wavelength is required. Thus, it is possible for the light emitting diodes to emit in the infra red spectrum, the visible spectrum, a portion of the visible spectrum (i.e. colored) and the ultra violet spectrum.

The plurality of metallic assemblies shown in FIG. 5 define a matrix of three groups with six assemblies within each group. Thus, there are a total of eighteen LED wafers 501 within the lighting apparatus. However, it should be appreciated that many alternative configurations could be deployed.

From an electrical perspective, the six assemblies within each group, including group 502, are connected in series and then each group is electrically connected in parallel. Group 502 includes a first assembly 503, a second assembly 504, a third assembly 505, a fourth assembly 506, a fifth assembly 507 and a sixth assembly 508. This configuration is then repeated for a second group 509 and a third group 510.

FIG. 6

Figure 6:
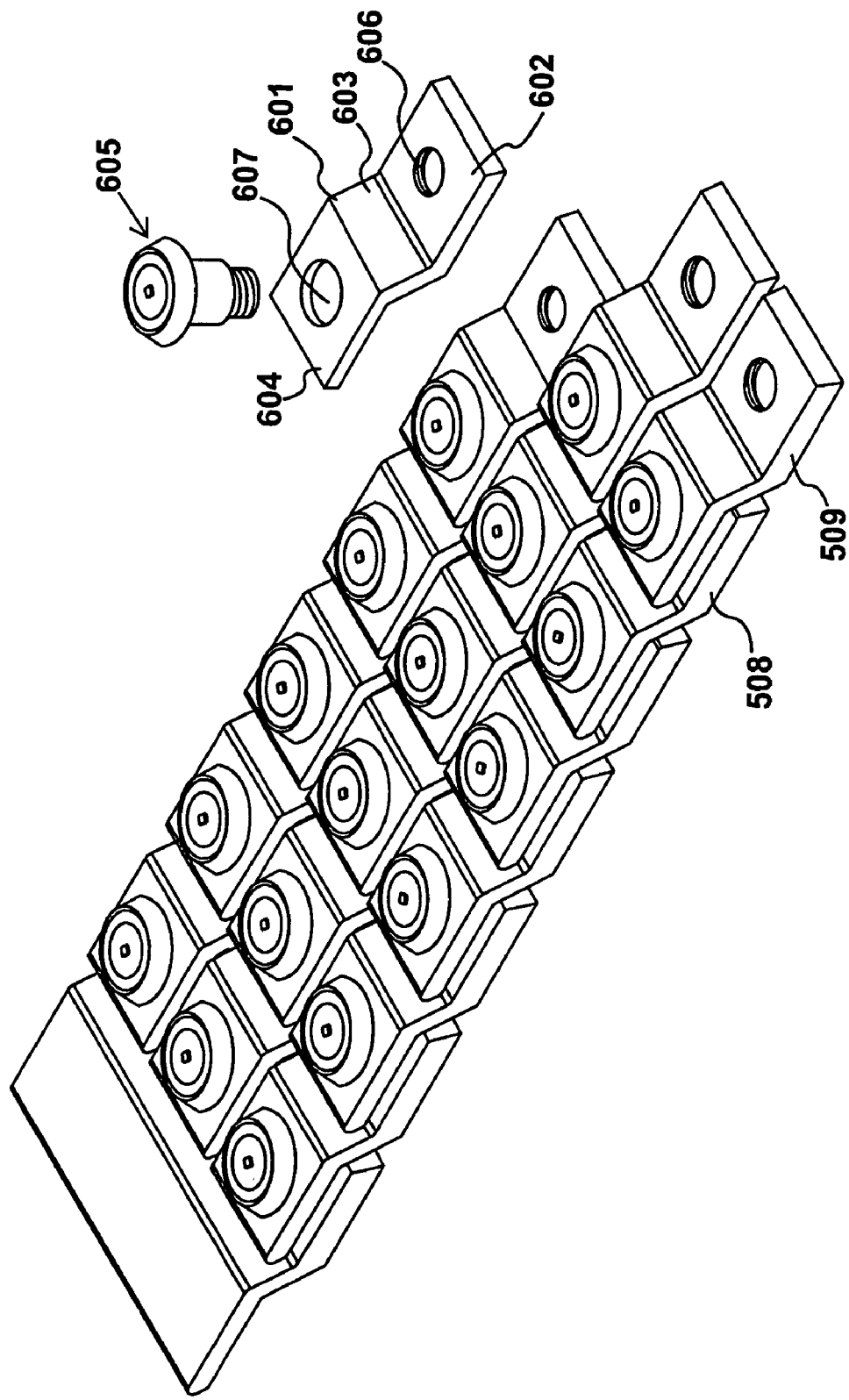
FIG. 6 illustrates procedures for creating the assemblies identified in FIG. 5, including a coaxial subassembly.

It can be seen from FIG. 6 that the individual metallic assemblies are arranged such as to define a regular matrix of light emitting diode devices. Each of the metallic assemblies includes an inclined bracket 601 having a based portion 602, an inclined portion 603 and a raised portion 604. The raised portion supports an LED subassembly 605.

Within the matrix, a first attached inclined bracket 508 is next to a second inclined bracket 509. The raised portion 604 of the second inclined bracket 509 is above the base portion 602 of the first inclined bracket 508. In this configuration, the base portion 602 of the first inclined bracket 508 lies between the raised portion 604 of the second inclined bracket 509 and the moulded casing.

The base portion 602 includes a lower threaded hole 606. The raised portion 604 includes an upper non-threaded hole 607.

FIG. 7

Figure 7:
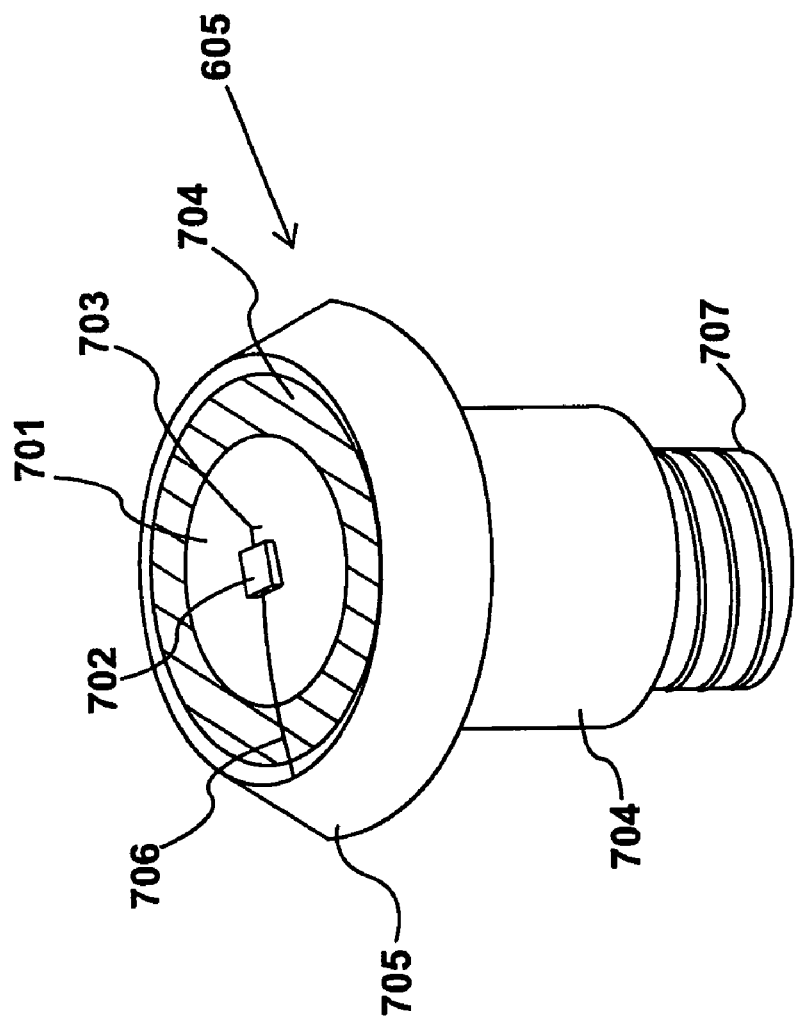
FIG. 7 details the coaxial subassembly identified in FIGS. 6.

An LED subassembly 605 is detailed in FIG. 7. The LED subassembly 605 includes an inner conductive element 701 which has an LED wafer 702 mounted thereon to provide thermal conduction of heat away from the LED wafer thereby allowing the LED wafer to operate at higher power ratings. In addition, a first electrical connection 703 is made between the LED wafer 702 and the inner electrically conductive element 701.

The LED subassembly 605 also includes a coaxial insulating element 704 that may be constructed from substantially similar material to that of the moulded casing. Thus, the coaxial insulating element 704 is electrically insulating while being thermally conductive.

The LED subassembly 605 also includes a coaxial outer conductive element 705 electrically insulated from the inner conducting elements 701. Furthermore, an electrical connection 706 is made between the LED wafer 702 and the coaxial outer conductive element 705.

The coaxial insulating element 704 extends below the coaxial outer conductive element. The coaxial outer conductive element 704 is received within an upper hole 607 of an aligned pair and may be held firmly within this upper hole by the provision of an interference fit.

The inner conductive element 701 extends below the coaxial insulating element 704 and includes a threaded portion 707. Threaded portion 707 engages with tapped hole 606 so as to secure each LED subassembly within the matrix of inclined brackets.

During the fabrication of the apparatus for illuminating accessible areas, the inclined metallic brackets shown in FIG. 5 are arranged within a mould. A casing, as shown in FIG. 4, is moulded around the inclined metallic brackets so as to support these inclined metallic brackets. The casing is moulded from an electrically insulating and thermally conductive plastics material. Individually supported light emitting diodes are then located within each of a respective one of the inclined metallic brackets. Thus, the close proximity of the LED device to the relatively large metallic components which are then in turn brought into close proximity with a thermally conductive plastic casing facilitates the dissipation of heat from the LED devices. In addition, this facilitates the replacement of individual LED devices, which in turn facilitates the use of the apparatus in situations requiring different light wavelengths.

FIG. 8

Figure 8:
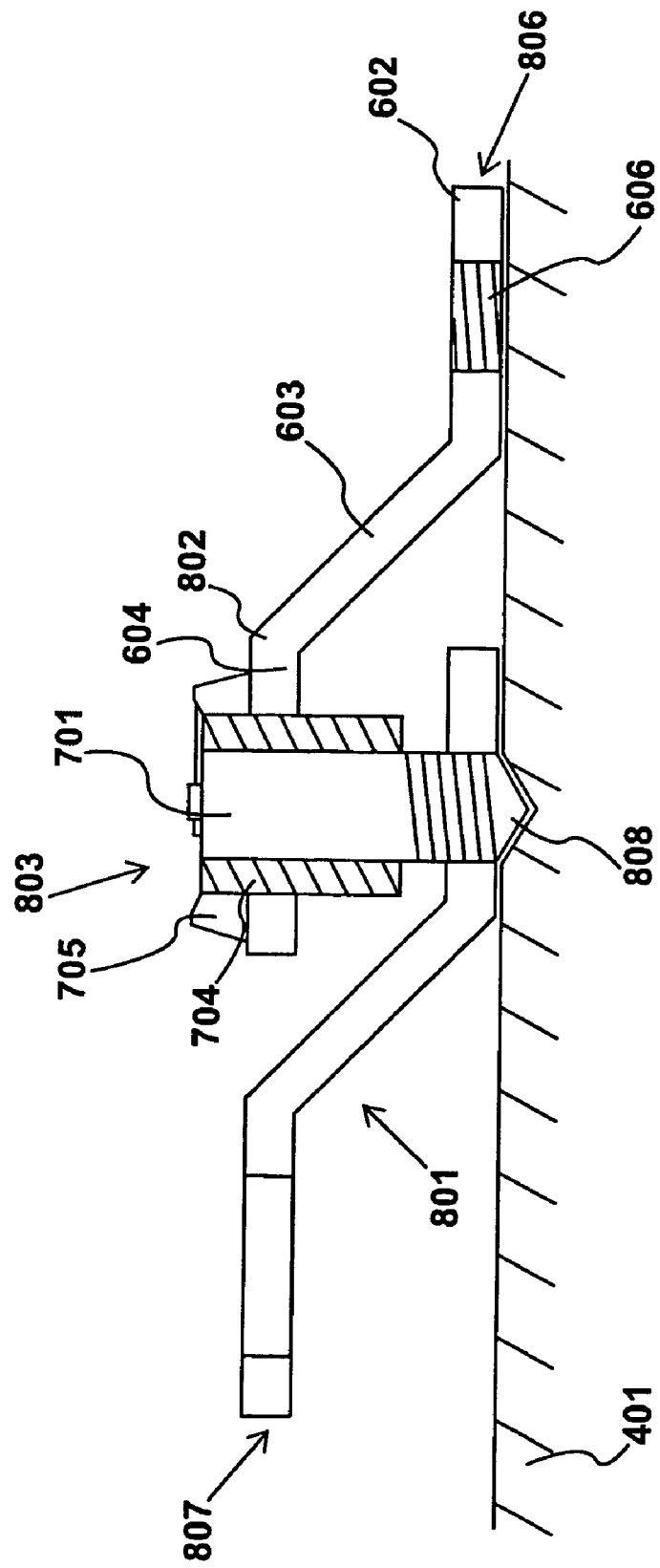
FIG. 8 shows a cross sectional view to illustrate the operation of the devices.

FIG. 8 illustrates how electrical power is supplied to each of the plurality of light emitting diode devices contained within the lighting apparatus. As shown in FIG. 5, a plurality of inclined metallic brackets are arranged in a matrix and for the purposes of this illustration, a first inclined bracket 801 is shown co-operating with a second inclined bracket 802 and an LED assembly 803. As previously described, each inclined metallic bracket includes a base portion 602, an inclined portion 603 and a raised portion 604. The base portion 602 includes a tapped lower hole 606 and the raised portion 604 includes an upper hole 607 that has a larger diameter than the lower hole.

A casing 401 is moulded around the inclined metallic brackets which then defines one or more groups. Thus, in this embodiment, three groups 502, 509 and 510 are established. Within each group, the brackets are serially connected, such that power is applied across the ends of each group and a plurality of groups are connected in parallel.

As held within the moulded casing, the lower hole 606 of the first bracket 801 is located directly below the upper hole 607 of the second bracket 802, thereby defining a matrix of aligned holes.

In production, the moulded casing is then removed from its mould, and, when so removed, the casing supports the brackets thereby electrically isolating them but providing thermal conductivity so as to dissipate heat generated by the LED devices. The moulded casing thereby provides a mechanical support for the devices and a heat sink for the devices.

LED subassemblies 803 are inserted through respective aligned holes, with each of the LED subassemblies including an inner conductive element 701, a coaxial insulating element 704 and a coaxial outer conductive element 705. An LED wafer 702 is mechanically and electrically connected to the inner conductive element 701 to facilitate electrical transmission and heat transmission. As previously described, an electrical connection is also made between the outer conductive element 705 and the LED wafer 702.

An electrical path is provided between a first end 806 of the group and a second end 807 of the group. Thus, starting from the first end 806, a current path is provided along inclined bracket 802 which is in mechanical contact with the outer conducting element 705 and the coaxial insulating element 704. In this embodiment, a secure mechanical interference fit is provided between the insulating element 704 and the outer conductor 705 but the presence of the insulating element 704 presents a direct electrical path between inclined bracket 802 and the inner conductor 701.

Electrical transmission to the inner conductor 701 is provided through the LED device. Thus, an electrical path is provided from a raised portion of a first inclined bracket 802 to an outer conducting element, through the LED device to the inner conducting element and from the inner conducting element to a base portion of the second inclined bracket 804. Thus, from here, similar pathways are repeated throughout the serially connected devices.

In an embodiment, the inner conductive element is terminated by a point 808 so as to embed the inner element within the plastic moulding 401, again enhancing thermal conductivity.

In the embodiment of FIG. 8, mechanical connections have been identified as being established through interference fit and threaded elements, although it should be appreciated that other mechanical fixtures may be deployed provided they maintain satisfactory thermal conduction characteristics.

The embodiment of FIG. 5 shows three groups of six LED devices. However, it should be appreciated that other arrangements may be adopted in which elements are connected in series to define a group and groups are then connected in parallel.

Figure 3A:
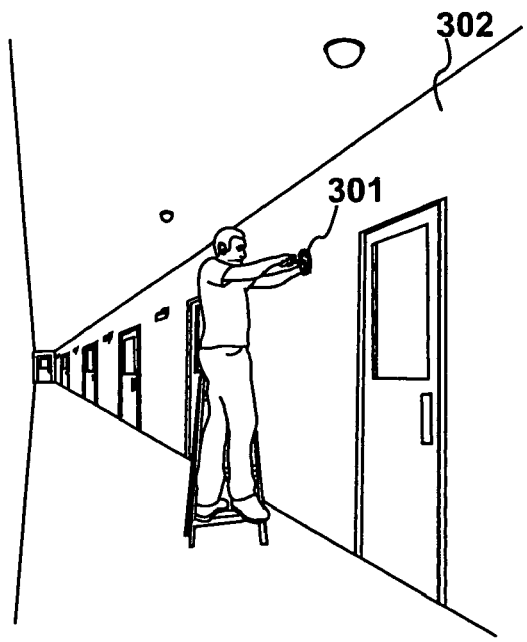
FIG. 3A shows the installation of a mounting bracket.
Figure 3B:
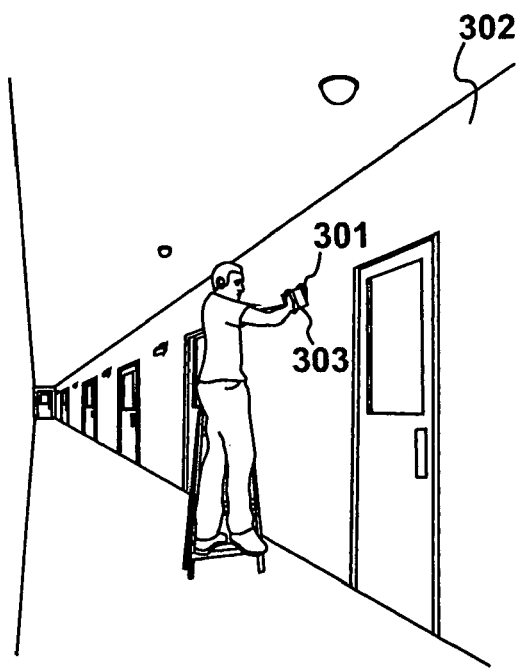
FIG. 3B shows the attachment of lighting apparatus to the mounting bracket of FIG. 2.

In an embodiment, electrical power is received from a mains supply such that during deployment, as shown in FIG. 3, it is necessary for each lighting apparatus to be connected to this mains supply. The apparatus itself, in an embodiment, includes procedures for rectifying the mains supply and controlling power input by a process of pulse width modulation.

I claim:

1. Lighting apparatus, comprising:
   a casing moulded from an electrically isolating and thermally conductive plastics material;
   a plurality of light emitting diode (LED) devices configured to emit light in response to receiving electrical power; and
   a plurality of overlapping metallic assemblies, wherein each one of said metallic assemblies provides electrical power to a respective one of said LED devices, conducts heat from its respective LED device to said casing, and is directly supported by said casing, wherein each of said metallic assemblies includes an inclined bracket, having a base portion attached to said casing, an inclined portion extending from said casing and a raised portion for supporting an LED subassembly.

2. The lighting apparatus of claim 1, configured to provide security lighting within said accessible areas, wherein said LED devices are individually replaceable so as to optimise the wavelength of emitted light for remote viewing purposes.

3. The lighting apparatus of claim 2, selectively operable with light emitting diodes in the infra-red spectrum, the visible spectrum, a portion of said visible spectrum and the ultra violet spectrum.

4. The lighting apparatus of claim 1, wherein said casing is moulded from at least one selected from the group comprising: E2 thermally conductive liquid crystalline polymer; E3603 thermally conductive polyamide 4,6; E3605 thermally conductive polyamide 4,6; E4501 thermally conductive polycarbonate; E405 thermally conductive polycarbonate; E4507 thermally conductive polycarbonate.

5. The lighting apparatus of claim 1, wherein said plurality of LED devices are divided into groups, wherein LED devices within each of said groups are electrically connected in series and said serially connected groups are electrically connected in parallel.

6. The lighting apparatus of claim 5, wherein said groups are arranged in a substantially regular matrix.

7. The lighting apparatus of claim 1, wherein an inclined bracket is attached to said casing for each of said LED devices.

8. The lighting apparatus of claim 7, wherein a first attached inclined bracket is next to a second inclined bracket in a matrix, the raised portion of the second inclined bracket is above the base portion of the first inclined bracket, such that said base portion of said first inclined bracket lies between said raised portion of said second inclined bracket and the casing.

9. The lighting apparatus of claim 1, wherein said LED sub assembly includes:
   an inner electrically conductive element having an LED wafer mounted thereon to provide thermal conduction of heat away from the LED wafer and a first electrical connection to said LED wafer;
   a coaxial insulating element of a thermally conducting plastics material moulded around the inner electrically conductive element; and
   a coaxial outer conductive element electrically connected to the LED wafer.

10. A method of fabricating lighting apparatus, comprising the steps of:
    arranging a plurality of overlapping inclined metallic brackets within a mould;
    moulding a casing around said inclined metallic brackets to support said inclined metallic brackets, wherein said casing is moulded from an electrically insulating and thermally conductive plastics material;
    locating individually supported light emitting diode (LED) devices within each of a respective one of said inclined metallic brackets, wherein each of said inclined metallic assemblies includes an inclined bracket, having a base portion attached to said casing, an inclined portion extending from said casing and a raised portion for supporting an LED subassembly.

11. The method of claim 10, wherein said individual LED devices are individually replaceable to adjust the wavelength of the light emitted therefrom.

12. The method of claim 11, wherein LED devices are operable within the infra-red spectrum, the visible spectrum and the ultra-violet spectrum.

13. The method of claim 10, wherein the casing is moulded from at least one selected from the group comprising: E2 thermally conductive liquid crystalline polymer; E3603 thermally conductive polyamide 4,6; E3605 thermally conductive polyamide 4,6; E4501 thermally conductive polycarbonate; E405 thermally conductive polycarbonate; E4507 thermally conductive polycarbonate.

14. The method of claim 10, wherein the individually supported light emitting diode devices are divided into groups, wherein LED devices within each of said groups are electrically connected in series and said serially connected groups are electrically connected in parallel.

15. A method of supplying electrical power to each of a plurality of light emitting diode (LED) devices contained within a lighting apparatus, comprising the steps of:
    defining a plurality of inclined metallic brackets each having a base portion, an inclined portion and a raised portion, wherein said base portion includes a lower hole and said raised portion includes an upper hole with a diameter greater than said lower hole;
    moulding a casing around inclined metallic brackets to establish one or more groups, in which the brackets contained within each group are serially connected and a lower hole of a first bracket in a group is located directly below an upper hole of a second bracket in the same group, thereby defining aligned holes;
    removing the moulded casing from a mould, in which the moulded casing when so removed supports said brackets and is electrically isolating and thermally conductive so as to dissipate heat generated by the LED devices;
    inserting LED sub-assemblies through respective aligned holes, wherein each of said LED sub-assemblies includes an inner conductive element, a co-axial insulating element, a co-axial outer conductive element and an LED wafer mechanically and electrically connected to said inner conductive element to facilitate electrical transmission and heat transmission, and electrically connected to said outer conductive element; such that:
    an electrical path is provided from a raised portion of a first inclined bracket to an outer conducting element, through the LED device to an inner conducting element and from said inner conducting element to a base portion of a second inclined bracket.

16. The method of claim 15, wherein the lower holes are tapped and threaded lower ends of respective inner conductive elements are threaded.

17. The method of claim 15, wherein said co-axial insulating elements are secured within respective upper holes.

18. The method of claim 15, wherein a plurality of groups of LED devices are included and said groups are electrically connected in parallel.

19. The method of claim 15, wherein electrical power is received from a mains supply, including the steps of rectifying said mains supply and controlling power input to the LED devices by a process of pulse width modulation.

* * * * *